United States Patent
Ohmi et al.

(10) Patent No.: US 7,538,012 B2
(45) Date of Patent: May 26, 2009

(54) FLUORINE-CONTAINING CARBON FILM FORMING METHOD

(75) Inventors: Tadahiro Ohmi, Sendai (JP); Masaki Hirayama, Sendai (JP)

(73) Assignees: Tadahiro OHMI, Sendai-shi (JP); Tokyo Electron Limited, Tokyo (JP)

( * ) Notice: Subject to any disclaimer, the term of this patent is extended or adjusted under 35 U.S.C. 154(b) by 316 days.

(21) Appl. No.: 10/558,080

(22) PCT Filed: May 19, 2004

(86) PCT No.: PCT/JP2004/006749

§ 371 (c)(1),
(2), (4) Date: Aug. 16, 2006

(87) PCT Pub. No.: WO2004/105114

PCT Pub. Date: Dec. 2, 2004

(65) Prior Publication Data

US 2007/0020940 A1    Jan. 25, 2007

(30) Foreign Application Priority Data

May 22, 2003  (JP) .............................. 2003-144613

(51) Int. Cl.
*H01L 21/322* (2006.01)
(52) U.S. Cl. .................................... 438/474
(58) Field of Classification Search ......... 438/473–476, 438/795–798; 427/534, 535; 257/753, 765
See application file for complete search history.

(56) References Cited

U.S. PATENT DOCUMENTS 6,428,894 B1    8/2002  Babich et al.
6,576,569 B1    6/2003  Fukiage
6,677,549 B2 *  1/2004  Suzuki et al. .......... 219/121.41

(Continued)

FOREIGN PATENT DOCUMENTS

EP     1 035 568 A1    9/2000

(Continued)

OTHER PUBLICATIONS

Valentini L. et al: "Relationship between the optical and mechanical properties of fluorinated amorphous carbon thin films" Journal of Non-Crystalline Solids, North-Holland Physics Publishing. Amsterdam, NL, vol. 291, No. 3, Oct. 2001, pp. 153-159.

(Continued)

*Primary Examiner*—Calvin Lee
(74) *Attorney, Agent, or Firm*—Crowell & Moring LLP

(57) ABSTRACT

The present invention is made to solve a problem to improve adhesion between a fluorine-containing carbon film and a foundation film. In order to achieve this object, according to the present invention, a fluorine-containing carbon film forming method of forming a fluorine-containing carbon film on a to-be-processed substrate includes: a first process of carrying out plasma excitation of a rare gas, and carrying out a surface treatment of the to-be-processed substrate with the use of the thus-plasma-excited rare gas with a substrate processing apparatus; and a second process of forming the fluorine-containing carbon film on the to-be-processed substrate, wherein the substrate processing apparatus has a microwave antenna electrically connected to a microwave power source.

11 Claims, 8 Drawing Sheets

U.S. PATENT DOCUMENTS 6,773,762 B1 * 8/2004 Fukiage ..................... 427/534
2002/0008088 A1 1/2002 Suzuki et al.

FOREIGN PATENT DOCUMENTS

| EP | 1 119 034 A1 | 7/2001 |
| EP | 1 122 769 A1 | 8/2001 |
| JP | 2000-208622 A | 7/2000 |
| JP | 2001-107246 | 4/2001 |
| JP | 2002-164330 A | 6/2002 |
| WO | WO 99/35684 A1 | 7/1999 |
| WO | WO 00/19507 A1 | 4/2000 |

OTHER PUBLICATIONS

Yi J. W. et al: "Annealing effects on structural and electrical properties of fluorinated amorphous carbon films deposited by plasma enhanced chemical vapor deposition" Thin Solid Films, Elsevier Sequoia, NL, vol. 423, No. 1, Jan. 1, 2003, pp. 97-102.
European Search Report dated Mar. 18, 2008 (Five (5) pages).
International Search Report dated Jun. 29, 2004.
Japanese Office Action dated Jul. 8, 2008 (two (2) pages).

* cited by examiner

| SURFACE TREATMENT / FOUNDATION | Si | SiN |
|---|---|---|
| WITHOUT SURFACE TREATMENT | 38 MPa | 32 MPa |
| WITH SURFACE TREATMENT | 46 MPa | 48 MPa |

FLUORINE-CONTAINING CARBON FILM FORMING METHOD

TECHNICAL FIELD

The present invention relates to an insulating film forming method, and in particular, to a fluorine-containing carbon film forming method.

BACKGROUND ART

Along with an improvement of performance of a semiconductor device, to reduce stray capacitance between interconnections in the semiconductor device and to increase an operation speed of the semiconductor device has been attempted. In order to reduce the stray capacitance between interconnections, a method of employing a material having a low dielectric constant as an interlayer dielectric formed between interconnections of the semiconductor devised is applied for example.

A silicon oxide film ($SiO_2$ film) having a relative dielectric constant on the order of 4 has been employed in the above-mentioned interlayer dielectric. However, recently, an increase in an operating speed of a semiconductor device is sought, with the use of a fluorine-containing silicon oxide film (SiOF film) having a relative dielectric constant on the order of a range of 3 to 3.5.

However, there is a limit to reduce the relative dielectric constant of the above-mentioned SiOF film. To achieve a relative dielectric constant equal to or less than 3 is difficult.

Various candidates exist for a so-called low dielectric constant interlayer dielectric having a low relative dielectric constant. However, the requirements include not only having a low relative dielectric constant but also having such a mechanical strength that it can be applied in a semiconductor device. This is a reason why a fluorine-containing carbon film (CF film) has taken attention, having a sufficient mechanical strength, and also, having a relative dielectric constant which is on the order of 2 or may be further lowered. Attempts have been made to employ it as a low dielectric constant insulating film of a next generation. [Patent Document] WO99/35684

However, when the above-mentioned fluorine-containing carbon film is applied in a semiconductor device as an interlayer dielectric, a problem exists such that adhesion between the fluorine-containing carbon film and a foundation is low.

FIG. 1(A) through (C) shows an example in which a fluorine-containing carbon film is formed on a silicon nitride film (SiN film). When a fluorine-containing carbon film is applied in a semiconductor device as an interlayer dielectric, in many cases the fluorine-containing carbon film is formed on a SiN film acting as a cap layer of a Cu film which is an interconnection layer of the semiconductor device.

With reference to FIG. 1(A), a SiN film 101 is formed on a to-be-processed substrate not shown. Further, on the SiN film 101, a deposit layer 102, having a very small thickness in comparison to the SiN film 101, made of water, organic matter, natural oxide or such, is formed. The deposit film 102 may be formed as a result of the to-be-processed substrate having the SiN film formed thereon being exposed to the atmosphere for example.

Next, in FIG. 1(B), a fluorine-containing carbon film 103 is formed in a plasma CVD (chemical vapor deposition) method or such.

However, since the deposit layer 102 exists on the SiN layer 101 as mentioned above, there is a case where, as shown in FIG. 1(C), the fluorine-containing carbon film 103 peels from the SiN film 101 together with the deposit layer 102, or the fluorine-containing carbon film 103 peels from the deposit layer 102.

Further, even when such peeling does not occur immediately after the fluorine-containing carbon film 103 is formed, the fluorine-containing carbon film 103 may peel during a process, included in a semiconductor device manufacturing process, such as a thermal processing process applying a thermal stress, a CMP (chemical mechanical polishing) process applying shearing force, or such. To ensure sufficient adhesion between the foundation film and the fluorine-containing carbon film, satisfying such a requirement, is difficult.

In order to ensure the adhesion, a method exists of removing the above-mentioned deposit layer 102, for example, by means of spatter etching in a plasma processing apparatus for example. However, there is a problem that the above-mentioned SiN film 101 acting as a foundation film of the fluorine-containing carbon film may be damaged by ion impact of the spatter etching.

The present invention has an object to provide a fluorine-containing carbon film, solving the above-mentioned problem.

A specific problem to be solved by the present invention is to provide a fluorine-containing carbon film forming method in which no damage is caused to a foundation film of a fluorine-containing carbon film, and adhesion between the fluorine-containing carbon film and the function film is improved.

DISCLOSURE OF THE INVENTION

In order to solve the above-mentioned problem, according to the present invention, a fluorine-containing carbon film forming method of forming a fluorine-containing carbon film on a to-be-processed substrate, comprising: a first process of carrying out plasma excitation of a rare gas, and carrying out a surface treatment of the to-be-processed substrate with the use of the thus-plasma-excited rare gas with a substrate processing apparatus; and a second process of forming the fluorine-containing carbon film on the to-be-processed substrate, wherein: in the substrate processing apparatus, a microwave transmitting window is provided to face the to-be-processed substrate, microwaves are introduced in a process space above the to-be-processed substrate via the microwave window from a microwave antenna electrically connected to a microwave power source and provided on the microwave transmitting window, and plasma excitation of a plasma gas including the rare gas is carried out, is employed.

In the present invention, the plasma processing apparatus carries out a surface treatment of the to-be-processed substrate, and thereby, adhesion between the fluorine-containing carbon film formed after the surface treatment and the surface of the to-be-processed substrate can be improved.

Further, since the plasma processing apparatus employs microwave plasma having a high density and a low electron temperature, the surface treatment can be carried out without any damage caused to the surface of the to-be-processed substrate.

BEST MODE FOR CARRYING OUT THE PRESENT INVENTION

Figure 1:
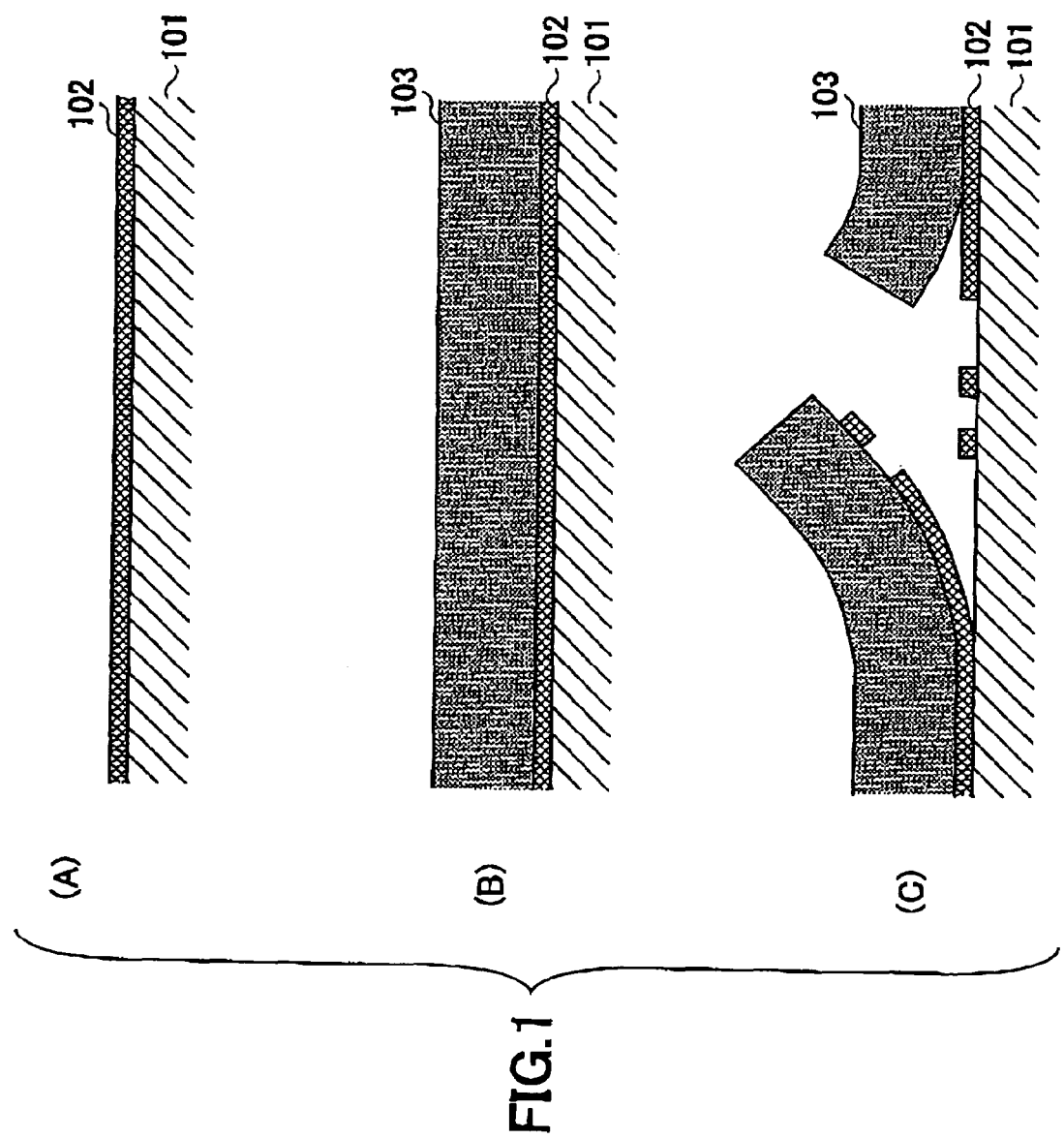
FIG. 1(A) through (C) shows a state in which a fluorine-containing carbon film peels.
Figure 2:
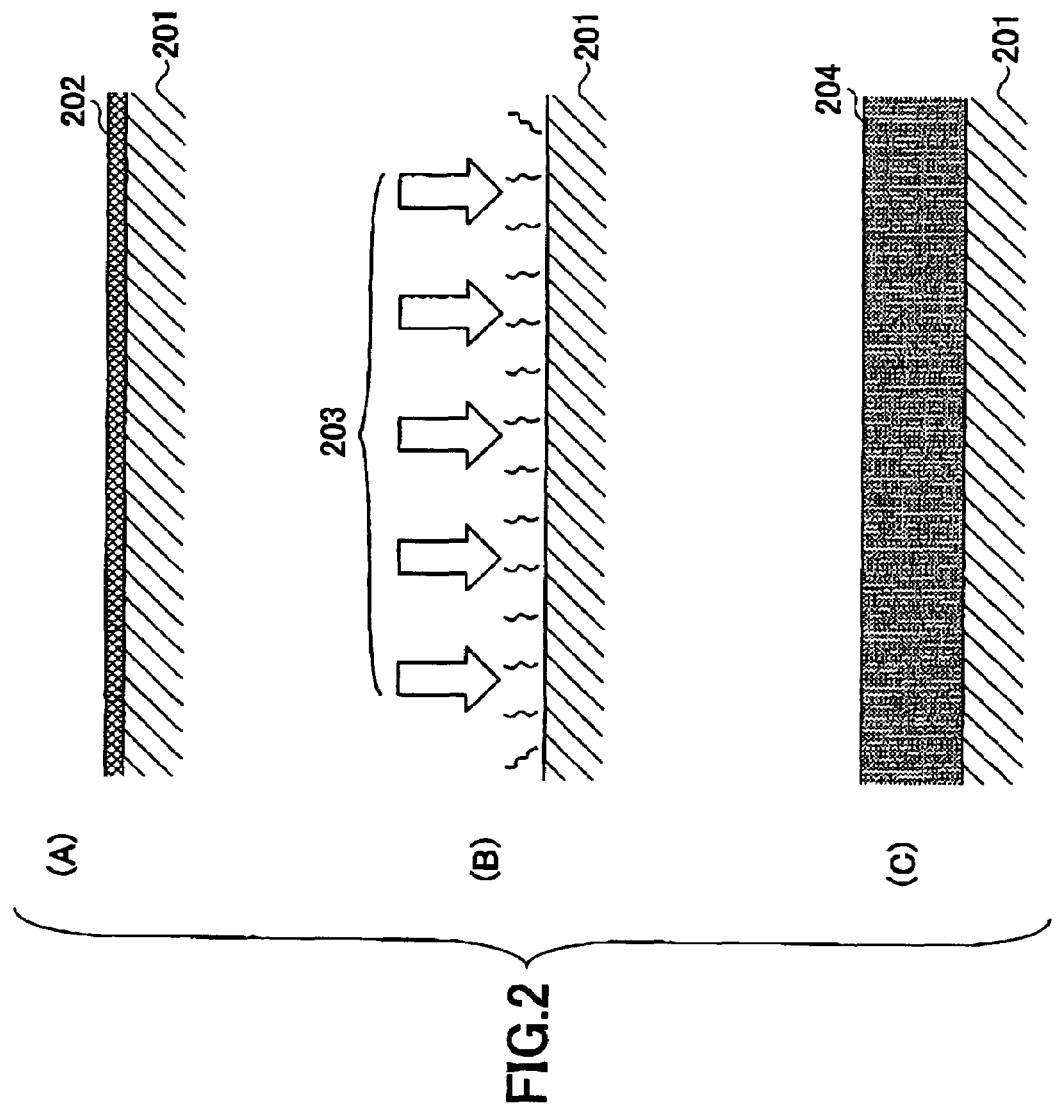
FIG. 2(A) thorough (C) diagrammatically shows a fluorine-containing carbon film forming method according to the present invention.

First, based on FIG. 2(A) through (C), a principle of improving adhesion between a foundation film on which a fluorine-containing carbon film is formed and the fluorine-containing carbon film, according to a fluorine-containing carbon film forming method according to the present invention, is described.

A fluorine-containing carbon film is applied as an interlayer dielectric produced between interconnection layers of a semiconductor device. For example, the fluorine-containing carbon film is produced on as silicon nitride film (SiN layer) which is a cap layer of a Cu layer which is an interconnection layer in many cases.

As shown in FIG. 2(A), on a to-be-processed substrate not shown, a SiN film (silicon nitride film) 201 is produced to be a foundation film of a fluorine-containing carbon film. On the SiN film 201, a deposit layer 202, made of water, organic matter, natural oxide or such for example, is formed. Typically, the deposit layer 202 is a thin film having a thickness on the order of 0.1 to 1 nm.

In many cases, the deposit layer 202 is formed when the SiN film 202 is exposed to the atmosphere having water or organic matter, for example, Ordinarily, an apparatus producing the SiN film 201 is different from an apparatus producing a fluorine-containing carbon film on the SiN film 201. Therefore, the to-be-processed substrate on which the SiN film 201 is formed should be transported in the atmosphere. Accordingly, to avoid forming of the deposit layer is very difficult.

Therefore, according to the present invention, as shown in FIG. 2(B), a surface treatment of the foundation film to remove the deposit layer 202 from the SiN film 201 is carried out by a reaction species such as ions or radicals obtained from microwave plasma excitation of a rare gas. At this time, the SiN film 201 may be damaged since energy hitting the SiN film 201 by ions increases when the plasma electron temperature is high and energy of ions included in the reaction species is high. Then, it is necessary to remove the deposit layer 202 without damaging the SiN film as the foundation film According to the present invention, in a plasma processing apparatus applying microwave plasma described later, microwave plasma having a low electron temperature is applied, and processing without damaging the SiN film 201 is made possible.

After the deposit layer 202 is removed in the process of FIG. 2(B), a fluorine-containing carbon film 204 is formed as shown in FIG. 2(C). Since the deposit layer 202, which causes a reduction in adhesion between the SiN film 201 and the fluorine-containing carbon film 204 is removed in the process of FIG. 2(B) as mentioned above, satisfactory adhesion can be kept between the SiN film 201 and the fluorine-containing carbon film 204.

Modes for carrying out the present invention are described next based on figures.

Embodiment 1

Figure 3:
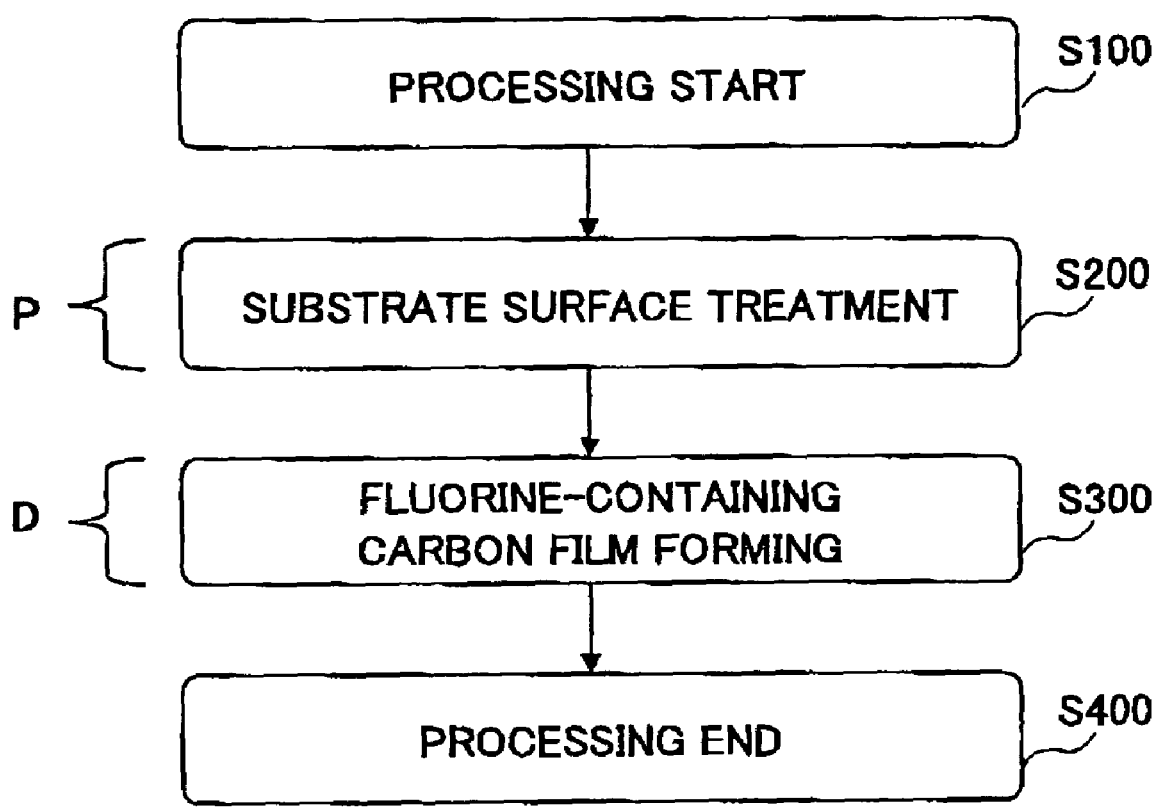
FIG. 3 shows a flow chart (#1) showing the fluorine-containing carbon film forming method according to the present invention.

FIG. 3 shows a flow chart of a fluorine-containing carbon film forming method according to an embodiment 1 of the present invention. As shown in FIG. 3, in the fluorine-containing carbon film forming method according to the present invention, after processing is started in Step 100 (indicated as s100 in the figure, and the same way being applied hereinafter), a surface treatment of a foundation film for a fluorine-containing carbon film, formed on a to-be-processed substrate, is carried out as mentioned above in Step 200, and thus, a deposit layer formed on a surface of the foundation layer is removed.

Next, in Step 300, a fluorine-containing carbon film is formed on the foundation film from which the deposit layer has been removed, and the processing is finished in Step 400.

As described above, the fluorine-containing carbon film forming method according to the present invention generally includes the surface treatment process P of removing the deposit layer from the surface of the foundation film and the film forming process D of forming the fluorine-containing carbon film.

Next, a plasma processing apparatus carrying out the above-mentioned surface treatment process P and the above-mentioned film forming process D is described.

Embodiment 2

Figure 4:
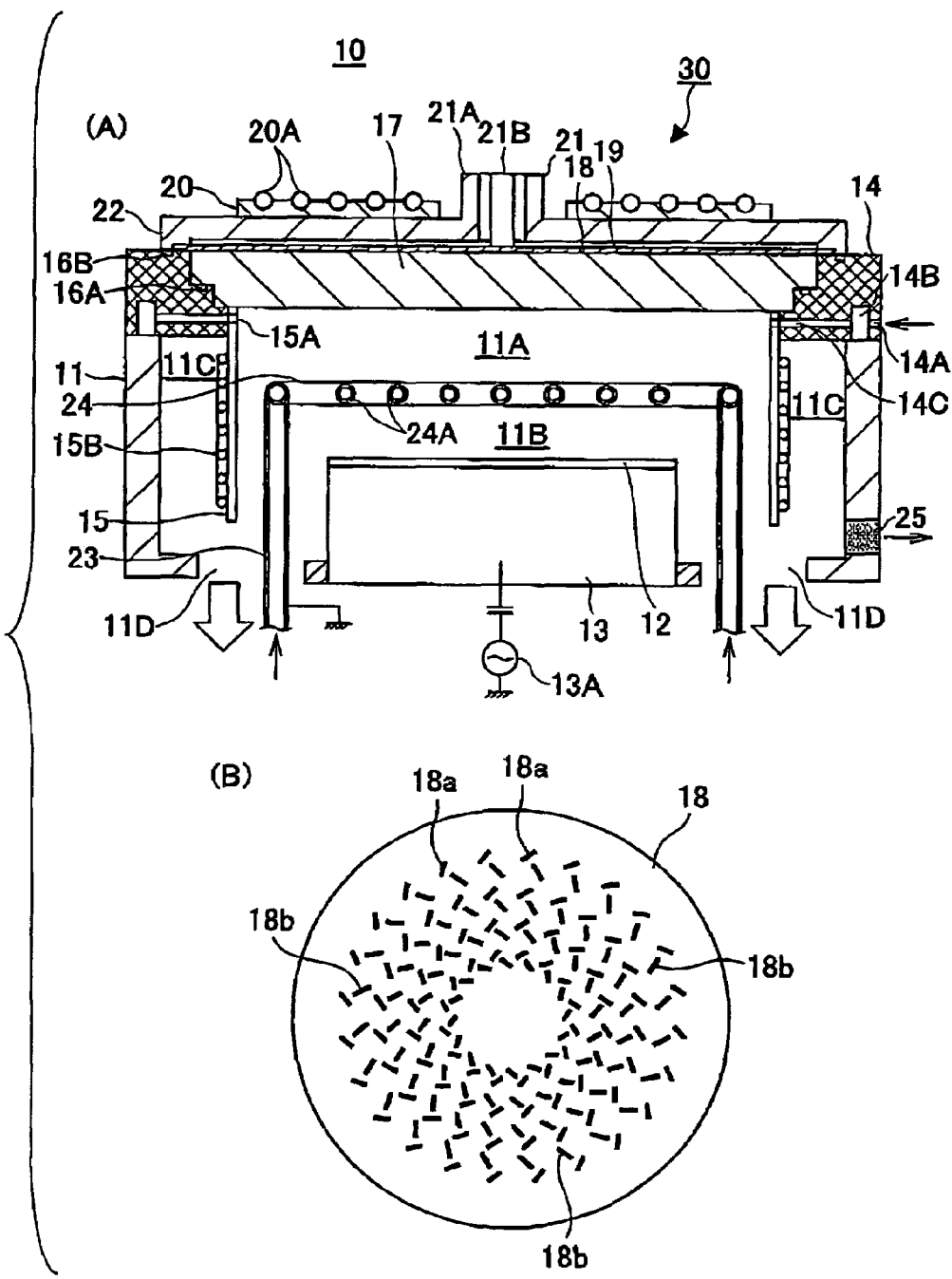
FIG. 4(A) and (B) shows a general view of a plasma processing apparatus carrying out the fluorine-containing carbon film forming method according to the present invention.
Figure 5:
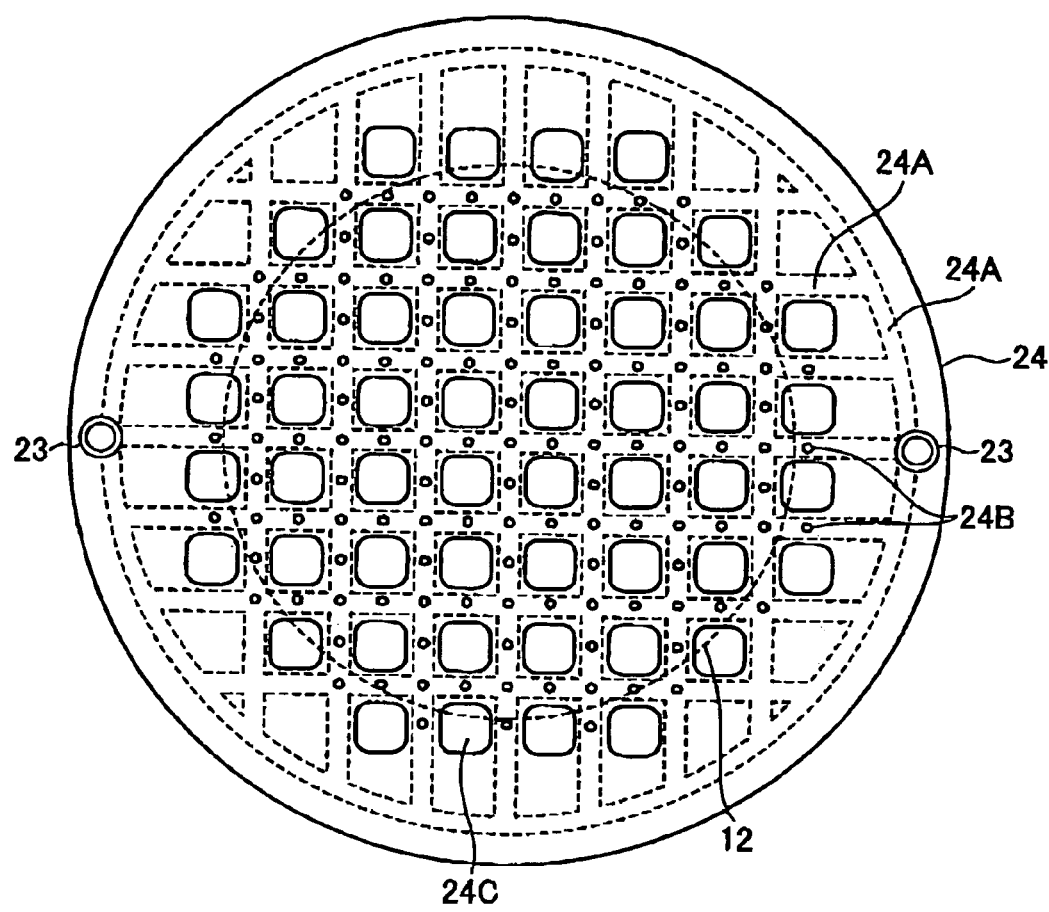
FIG. 5 shows a bottom view of a processing gas supplying structure employed by the plasma processing apparatus of FIG. 4.

First, based on FIGS. 4(A), (B) and FIG. 5, a plasma processing apparatus 10 carrying out the above-mentioned surface treatment process P and the above-mentioned film forming process D is described.

With reference to FIG. 4(A), the plasma processing apparatus 10 has a processing chamber 11, and a holding table 13 provided in the processing chamber 11 for holding a to-be-processed substrate 12 by means of an electrostatic chuck, preferably made of AlN or $Al_2O_3$ produced in a hot isostatic pressing method (HIP).

The inside of the processing chamber 11 is separated by an inside separate wall into a space nearer to a center of the holding table 13 and a space 11C formed between the inside separate wall 15 and the processing chamber. Further, the central space is generally separated, by a grid-like gas passage 24A of a processing gas supplying structure described later into a space 11A on a side nearer to the holding table 13 and a space 11B, which faces the space 11A via the processing gas supplying structure.

The spaces 11A, 11B and 11C forming the inside of the processing chamber 11 is exhausted or reduced in its pressure by means of an exhaust means such as a vacuum pump through exhaust ports 11D, produced at least at two places or preferably three places at equal intervals to surround the holding table 13, that is, in a symmetrical relationship with respect to the to-be-processed substrate 12 on the holding table 13.

The processing chamber 11 is made preferably of austenitic stainless steel including Al, and a protection film made by aminium oxide is produced on its inner wall surface by means of an oxidation treatment. Further, a microwave transmitting window 17 transmitting microwaves is set in a portion of the outer wall of the processing chamber 11 corresponding to the to-be-processed substrate 12. Further, between the microwave transmitting window 17 and the processing chamber 11, a plasma gas introducing ring 14 introducing a plasma gas is inserted. These parts form respective portions of the outer wall of the processing chamber 11.

The microwave transmitting window 17 has a step shape in the periphery, and the step shape engages with a step shape provided to the plasma gas introducing ring 14. Further, a sealing ring 16 is provided. Thereby, the processing chamber 11 is kept airtight.

A plasma gas is introduced to the plasma gas introducing ring from a plasma gas introducing opening 14A, and the plasma gas diffuses in a gas groove 14B produced approximately in a ring shape. The plasma gas in the gas groove 14B is supplied to the space 11A via plasma gas supplying holes 15B produced in the inside separate wall 15 mounted to the plasma gas introducing ring 14, from a plurality of plasma gas holes 14C communicating to the gas groove 14B.

The inside separate wall 15 is made of an approximately cylindrical, electrically conductive material, for example, a stainless alloy. A heater 15B is provided outside of the inside separate wall 15, i.e., on a surface facing the outer wall of the processing chamber 11. Thereby, the inside separate wall 15 can be heated. Further, the inside separate wall 15 is electrically connected to the plasma gas introducing ring 14, and is grounded via the plasma gas introducing ring 14.

The microwave transmitting window 17 is made delicate, and made of $Al_2O_3$ in the HIP method. The $Al_2O_3$ microwave transmitting window 17 produced in the HIP method is produced with the use of $Y_2O_3$ as a sintering assistant, has porosity equal to or less than 0.03% and does not substantially include voids or pinholes, and has very large thermal conductivity as a ceramic, reaching 30 W/m·K, although not so large as to approach AlN.

A radial line slot antenna 30, configured by a slot plate 18, close to the microwave transmitting window 17, having many slots 18a and 18b as shown in FIG. 4(B); a disk-shaped antenna body 22 supporting the slot plate 18; and a phase delaying plate 19, sandwiched between the slot plate 18 and the antenna body 22, made of a low-loss dielectric material such as $SiO_2$ or $Si_3N_4$, is provided on the microwave transmitting window 17.

The radial line slot antenna 30 is loaded on the processing chamber 11 with the plasma gas introducing ring 14 inserted therebetween. To the radial line slot antenna 30, microwaves having a frequency of 2.45 GHz or 8.3 GHz is supplied by an external microwave source (not shown) via a coaxial waveguide 21.

The microwaves thus supplied are emitted to the inside of the processing chamber 11 from the slots 18a and 18b of the slot plate 18 through the microwave transmitting window 17. Thereby, in the space 11A imediately below the microwave transmitting window 17, plasma is excited in a plasma gas supplied from the plasma gas supplying holes 15A. A configuration is made such that, the excited plasma can be observed, or emission spectrum thereof can be measured through a measurement window made of, for example, quartz, sapphire or such, provided in the processing chamber 11.

A sealing ring 16B is employed to seal between the radial line slot antenna 30 and the plasma gas introducing ring. In order to improve adhesion between the radial line slot antenna 30 and the microwave transmitting window 17, a pressure in a gap formed between the slot plate 18 and the microwave transmitting window 17 is reduced by means of a vacuum pump (not shown). Thus, by means of an atmospheric pressure, the radial line slot antenna 30 can be tightly pressed to the microwave transmitting window 17.

An outer waveguide 21A of the coaxial waveguide 21A is connected to the disk-shaped antenna body 22, and a central waveguide 21B is connected to the slot plate 18 via an opening part formed in the phase delaying plate 19. Thereby, microwaves supplied to the coaxial waveguide 21A are emitted through the slots 18a and 18b with progressing between the antenna body 22 and the slot plate 18 in a radial direction.

FIG. 4(B) shows the slots 18a and 18b formed in the slot plate 1B.

With reference to FIG. 4(B), the slots 18a are arranged concentrically, and the slots 18b, perpendicular thereto are also formed concentrically, corresponding to the respective slots 18a. The slots 18a and 18b are formed at intervals corresponding to a wavelength of the microwaves compressed by the phase delaying plate 19. As a result, the microwaves are emitted in a form of approximately plane waves from the slot plate 18. At this time, since the slots 18a and the slots 18b are formed in an orthogonal relation, the microwaves thus emitted form circularly polarized waves including two orthogonal polarization components.

Further, in the plasma processing apparatus 10 of FIG. 4(A), a cooling block 20 having cooling water passages 20A formed therein is produced on the antenna body 22. As a result of the cooling block 20 being cooled by cooling water in the cooling water passages 20A, heat accumulated in the microwave transmitting window 17 is absorbed via the radial line slot antenna 30. The cooling water passages 20A are formed in a spiral shape in the cooling block 20, and, preferably, cooling water, from which dissolved oxygen is removed through bubbling with a $H_2$ gas, and also, in which a redox potential is controlled, is made to pass therethrough.

Further, in the plasma processing apparatus 10 of FIG. 4(A), a processing gas supplying structure 24, made of an electric conductor, is set in the processing chamber 11 between the microwave transmitting window 17 and the to-be-processed substrate 12 on the supporting table 13 in such a manner that it stands up by being supported by the processing gas introducing passage 23. A structure is provided such that, in the processing gas introducing passage 23, a processing gas is introduced from processing gas injection holes (not shown) provided in the outer wall of the processing chamber 11.

The processing gas supplying structure 24 has grid-like processing gas passages 24A communicating with the processing gas introducing passages 23. Further, the processing gas supplying structure 24 supplies the processing gas in the space 11B through many processing gas supplying holes 24B communicating the space 11B from the processing gas passages 24A. Therewith, uniform substrate processing is carried out in the space 11B.

FIG. 5 shows a bottom view of a configuration of the processing gas introduction structure 24 of FIG. 4(A).

With reference to FIG. 5, the processing gas introducing structure 24 is made of an electric conductor such as an Al alloy including Mg, Al-containing stainless steel, or such for example, has the processing gas supplied thereto as a result of the grid-like processing gas passages 24A being connected to the processing gas introducing passages 23, and emits the processing gas in the space 11B uniformly through the many processing gas supplying holes 24B formed in a bottom plate thereof. Further, the processing gas introducing passages 23 are made of an electric conductor, and as a result, the processing gas supplying structure 24 is grounded via the processing gas introducing passages 23 as a result of being connected thereto.

Further, opening parts 24C are formed in the processing gas supplying structure 24 between adjacent ones of the processing gas passages 24A for causing plasma or a gas to pass therethrough. When the processing gas supplying structure 24 is made of an Mg-containing Al alloy, a fluoride film should be preferably provided on the surface thereof. Further, when the processing gas supplying structure 24 is made of Al-containing stainless steel, a passive film of aluminum oxide should be preferably formed on the surface thereof. Since an electron temperature in plasma excited is low in the plasma processing apparatus 10 according to the present invention, plasma incident energy is small, and thus, a problem, that the processing gas supplying structure 24 is spattered and metal contamination occurs in the to-be-processed substrate, can be avoided.

The grid-like processing gas passages 24A and the processing gas supplying holes 24B are provided in such a manner that they cover an area somewhat larger than the to-be-processed substrate 12 indicated by a broken line in FIG. 5. As a result of the processing gas supplying structure 24 being provided between the microwave transmitting window 17 and the to-be-processed substrate 12, plasma excitation of the processing gas can be made to occur, and uniform processing by means of the thus-obtained plasma-excited processing gas can be carried out.

When the processing gas supplying structure 24 is made of an electric conductor such as a metal, the processing gas supplying structure 24 forms a short-circuit plane of microwaves, as a result of a mutual separation of the grid-like processing gas passages 24A being set shorter than a wavelength of the microwaves.

In this case, microwave excitation of plasma occurs only in the space 11A, and, the processing gas is activated in the space 11B including a surface of the to-be-processed substrate, by plasma diffusion from the excitation space 11A. Further, since the to-be-processed substrate 12 can be prevented from being exposed directly to the microwaves at a time of plasma ignition, damage of the to-be-processed substrate 12 by the microwaves can be avoided.

In the plasma processing apparatus 10 according to the present embodiment, since supply of the processing gas is controlled uniform with the use of the processing gas supplying structure 24, a problem of excessive detachment on the surface of the to-be-processed substrate 12 with the processing gas can be eliminated, and desired processing can be carried out up to a deep portion of a large-aspect structure even when the structure having the large aspect is formed on the surface of the to-be-processed substrate 12. That is, the plasma processing apparatus 10 is advantageous for manufacturing of semiconductor devices in many generations having different design rules.

Embodiment 3

Figure 6:
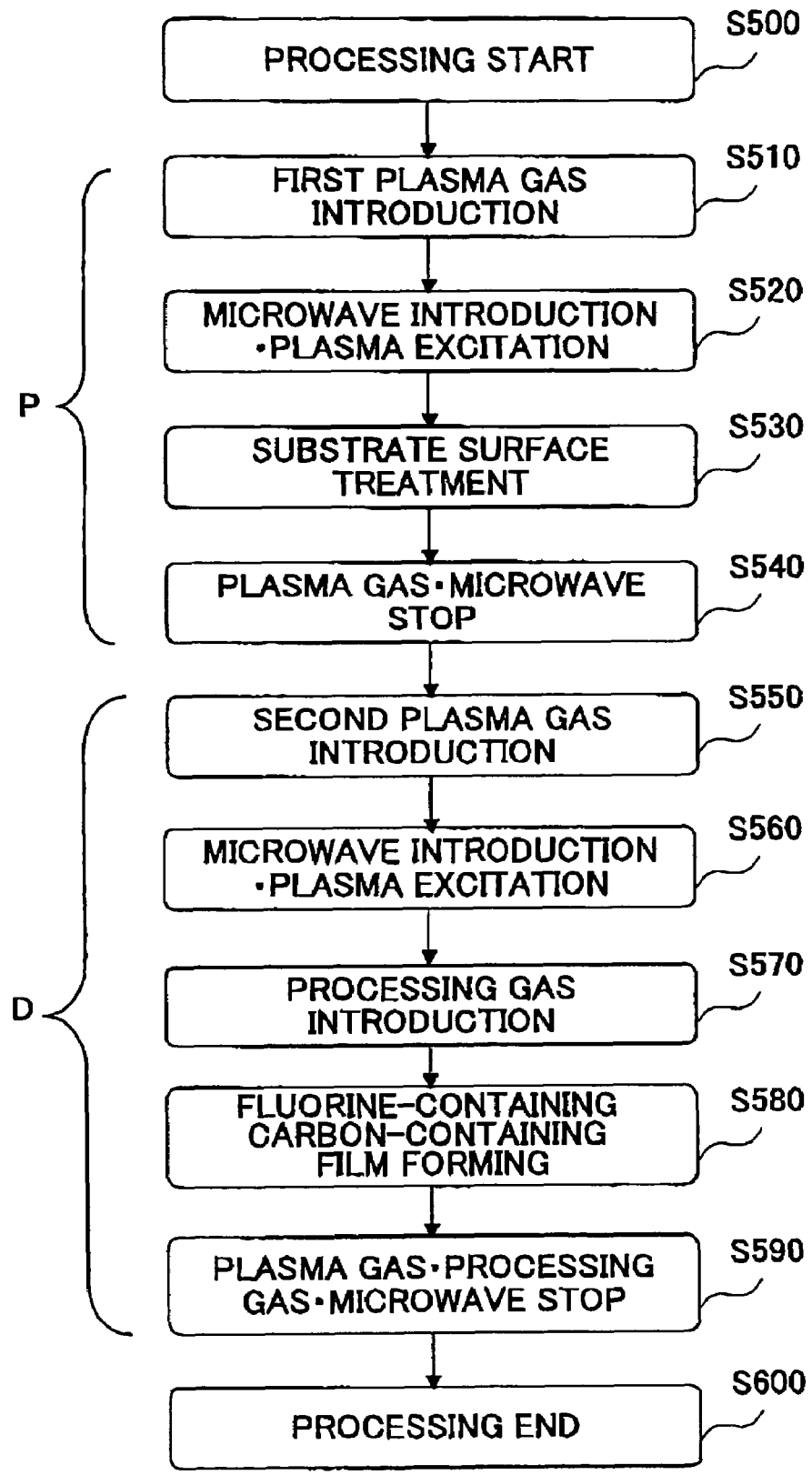
FIG. 6 shows a flow chart (#2) showing the fluorine-containing carbon film forming method according to the present invention.

Next, a flow chart of FIG. 6 shows a specific fluorine-containing carbon film forming method applying the above-mentioned plasma apparatus 10. FIG. 6 specifically shows a fluorine-containing carbon film forming method shown in FIG. 2(A) through (C) and FIG. 3.

With reference to FIG. 6, the fluorine-containing carbon film forming method according to the present invention includes, as mentioned above, the to-be-processed substrate surface treatment process P and the film forming process D forming a fluorine-containing carbon film after the surface treatment.

First, when processing is started in Step 500, an Ar gas is introduced at 400 sccm from the above-mentioned plasma gas supplying ring 14 as a first plasma gas, in Step 510.

Next, in Step 520, from the radial line slot antenna 30, microwaves are introduced in the processing chamber 11 through the microwave transmitting window 17, and microwave plasma is excited. At this time, since the radial line slot antenna 30 is applied, the microwaves are emitted in a form of approximately plane waves from the slot plate 18, and also, produces circularly polarized waves including two orthogonal polarization components. Thereby, plasma having a high density at a low electron temperature can be excited.

As a result, in Step 530, a reaction species including Ar ions required for the substrate surface treatment is sufficiently generated, and, by means of spattering mainly with the Ar ions, the above-mentioned deposit layer 202 can be removed from the SiN layer. Further, since the electron temperature is low, energy of hitting the SiN film 201 with the Ar ions can be controlled low, and no damage is caused to the SiN film 201. In order to thus prevent the foundation film such as the SiN film for a fluorine-containing carbon film from being damaged, plasma having a so low electron temperature that ion energy may be equal to or less than the order of 6 eV is required.

In the present step, through processing for 20 seconds with a pressure of 133 Pa (1 Torr) at a Ar flow rate of 400 sccm with microwave power of 1800 kW, the deposit layer 202 made of water, organic matter, natural oxide film or such on the SiN film 201 can be removed without any damage caused to the SiN film 201. In this case, Ar ion energy is 5.6 eV, and no damage is caused to the SiN film.

Next, in Step 540, the microwave introduction and the plasma gas supply are stopped, and the surface treatment process P is finished.

Next, the film forming process D of forming a fluorine-containing carbon film on the SiN film 201, which is thus cleaned as a result of the surface treatment being thus finished, is started.

When the film forming process is started in Step 550, Ar and $H_2$ are introduced in the processing chamber 11 from the plasma gas supplying ring 14 at 600 sccm and 40 sccm, respectively, as a second plasma gas.

Next, in Step 560, microwaves are introduced, and plasma is excited as mentioned above for Step 520. After that, in Step 570, from the processing gas supplying structure 24, a fluorocarbon series gas, for example, $C_4F_8$, is introduced at 30 sccm, and film forming for a fluoro-containing carbon film is started.

In Step 580, the film forming processing is carried out at an Ar flow rate of 600 sccm, a $H_2$ flow rate of 40 sccm, a $C_4F_8$ flow rate of 30 sccm with microwave power of 2000 W. Thereby, at a film forming rate of 340 nm/min., a fluoro-containing carbon film 204 with a dielectric constant on the order of 2.1 is formed on the SiN film 201. At this time, as mentioned above, since the microwave plasma with a high density at a low electron temperature is applied, the fluoro-containing carbon film with the low dielectric constant and the high film quality can be formed.

Next, in Step 590, introduction of the plasma gas, the processing gas and the microwaves is stopped, and the processing is finished in Step 600.

Since the deposit layer 202 is removed from the SiN film 201 applied as a foundation film on which the fluorine-containing carbon film is formed, adhesion between the fluorine-containing carbon film 204 formed in Step 590 and the SiN film 201 becomes satisfactory, and further, no damage influence is caused to the foundation for the fluorine-containing carbon film as mentioned above.

By the reason mentioned above, the fluorine-containing carbon film formed in the fluorine-containing carbon film forming method according to the present invention is positively provided with adhesion by which a thermal processing process and a CMP process of a semiconductor device manufacturing process can be endured, and the fluorine-containing carbon film can be applied as a low dielectric constant interlayer dielectric in a semiconductor device.

Further, in the present invention, although Ar is introduced in Step 510, Kr or Xe may be applied, by which ion energy can be further reduced when plasma excitation is carried out. For example, when Kr is applied instead of Ar in the present embodiment, ion energy can be reduced into 3.9 eV, or the same can be reduced into 2.9 eV when Xe is applied. Thereby, damage caused to the SiN film can be further reduced.

Further, the foundation film, of which adhesion with the fluorine-containing carbon film is improved, is not limited to the SiN (silicon nitride film). Also for a case where a fluorine-containing carbon film is formed with the use of an insulating film such as Si, SiO2, SiON, SiOC, SiCO(H), W, WN, Ta, TaN, Ti, TiN, Cu, Al, another insulating film (SOD film or such) formed by a spin coating method, a metal film, a metal nitride film, a metal oxide film or such as the foundation film, adhesion between the fluorine-containing carbon film and the foundation film can be improved without any damage caused to the foundation film, the same as the present embodiment.

Embodiment 4

Figure 7:
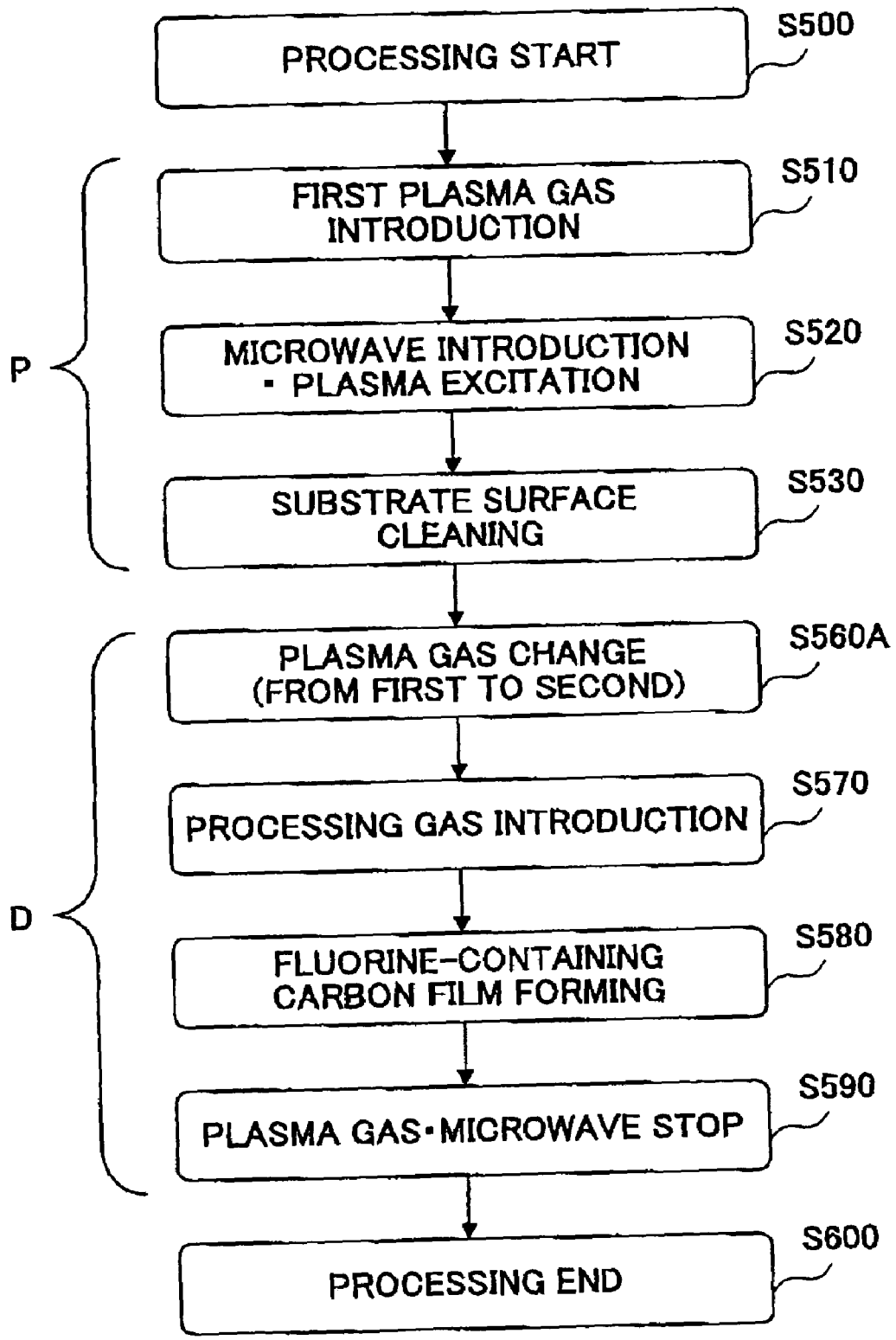
FIG. 7 shows a flow chart (#3) showing the fluorine-containing carbon film forming method according to the present invention.

Even when the fluorine-containing carbon film forming method shown in FIG. 6 is changed to that shown in FIG. 7, the same advantages as those shown in the embodiment 3 can also be obtained.

FIG. 7 shows a flow chart of a fluorine-containing carbon film forming method in an embodiment 4 of the present invention. In this figure, the same reference numerals are given to parts the same as those described above, and description thereof is omitted.

Steps 500 through 530 and Steps 570 through 600 in the present embodiment are the same as those of the case shown in FIG. 6.

In the present embodiment, in Step 560A, a plasma gas is switched.

This means that, processing of switching the first plasma gas into the second plasma gas is carried out for subsequent film forming processing for a fluorine-containing carbon film, after the end of the surface treatment removing the deposit layer 202 in the preceding Step 530.

Specifically, from a state where Ar is supplied at 400 sccm as the first plasma gas in the preceding Step 530, Ar, together with $H_2$, is introduced as the second plasma gas, at respective flow rates of Ar and $H_2$ set in 600 sccm and 40 sccm. After that, successively, a transition is made into film forming for a fluorine-containing carbon film.

As a result of the gas being switched with the plasma excitation being maintained, the transition can be made successively from the surface treatment process P to the film forming process D. Thus, a substrate processing time can be shortened, and forming of a fluorine-containing carbon film can be carried out efficiently.

Also in the present embodiment, a fluorine-containing carbon film having satisfactory adhesion with a foundation film can be formed without any damage caused to the foundation film of the fluorine-containing carbon film.

Embodiment 5

Next, a result of improvement of adhesion between the foundation film and the fluorine-containing carbon film by the fluorine-containing carbon film forming method according to the present invention is described.

Figures 8, 9:
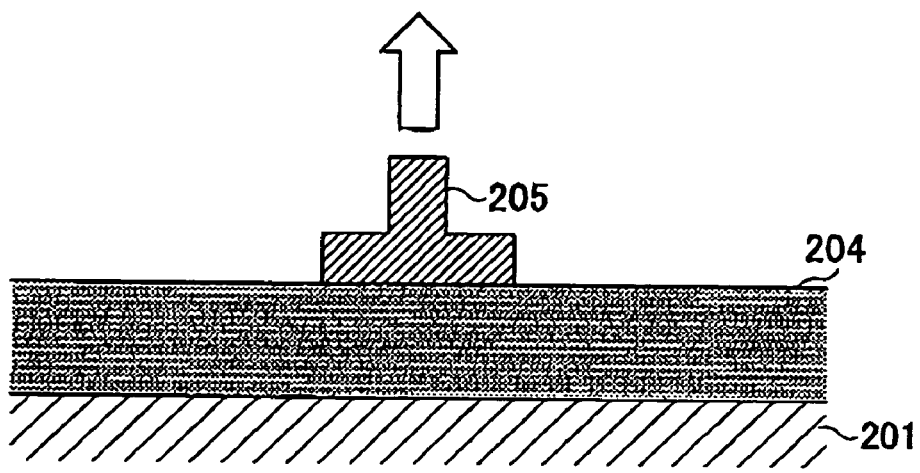
FIG. 8 diagrammatically shows a fluorine-containing carbon film adhesion measurement method.
FIG. 9 shows a fluorine-containing carbon film adhesion measurement result.

FIG. 8 shows a fluorine-containing carbon film adhesion measuring method. In the figure, the same reference numerals are given to parts the same as those described above, and description thereof is omitted. For example, when adhesion of the fluorine-containing carbon film formed on the SiN film on the to-be-processed substrate is measured, first a test rod 205 is fixed to the fluorine-containing carbon film 204 with a predetermined adhesive as shown in FIG. 8. Then, in a state in which the to-be-processed substrate is fixed, a load is applied to the test rod 205 in a direction of removing it from the to-be-processed substrate, and the load at which the fluorine-containing carbon film 204 peels is obtained as adhesion.

FIG. 9 shows results of the measurement of adhesion between the fluorine-containing carbon film and the foundation film made by the adhesion measuring method shown in FIG. 8. Experiments were carried out for a case where the fluorine-containing carbon film forming method according to the present invention shown in FIG. 6 is applied and a case where the process of Steps 500 through 550 in FIG. 6, i.e., the foundation film surface treatment, was not carried out, and the results were compared.

Further, experiments were carried out, in these two types, for a case where the fluorine-containing carbon film was formed on the SiN film formed on the Si substrate, and a case where the fluorine-containing carbon film was formed directly on the Si substrate, respectively.

With reference to FIG. 9, for each of the case where the fluorine-containing carbon film is formed on the SiN film and the fluorine-containing carbon film is formed directly on the Si substrate, it is seen that adhesion between the fluorine-containing carbon film and the foundation was remarkably improved as a result of the surface treatment shown in Steps 500 through 550 of FIG. 6 being carried out.

For example, it is seen that, when the fluorine-containing carbon film is formed on the SiN film, the adhesion is 32 MPa for the case where the surface treatment of the SiN film is not carried out, and in contrast thereto, when the surface treatment is carried out, the adhesion is improved into 48 MPa.

It is presumed that this results from improvement of adhesion between the fluorine-containing carbon film and the SiN film thanks to removal of water, organic matter, natural oxide film or such from the foundation for the fluorine-containing carbon film as mentioned above.

Further, the foundation film is not limited to the SiN film or Si. Also when another insulating film such as an oxide film, a nitride film, an oxynitride film, a metal film, a metal oxide film, a metal nitride film or such is applied as the foundation film, adhesion between the fluorine-containing carbon film and the foundation film can be improved without any damage caused to the foundation film.

Thus, the preferred embodiments of the present invention have been described. However, the present invention is not limited to the above-mentioned specific embodiments, and variations/modifications can be made without departing from points of the present invention claimed in the claims.

INDUSTRIAL APPLICABILITY

According to the present invention, adhesion between a fluorine-containing carbon film formed after a surface treatment is carried out and a surface of a to-be-processed substrate can be improved as a result of the surface treatment of the to-be-processed substrate being carried out in a plasma processing apparatus.

Further, since microwave plasma having a high density and a low electron temperature is applied, the above-mentioned surface treatment can be carried out without any damage caused to the surface of the to-be-proceed substrate.

The invention claimed is:

1. A fluorine-containing carbon film forming method of forming a fluorine-containing carbon film on a to-be-processed substrate, comprising:
   a first process of carrying out plasma excitation of a rare gas, and carrying out a surface treatment of the to-be-processed substrate with the use of the thus-plasma-excited rare gas with a substrate processing apparatus; and
   a second process of forming the fluorine-containing carbon film on the to-be-processed substrate having undergone the surface treatment in said first process, wherein:
   in said substrate processing apparatus, a microwave transmitting window is provided to face the to-be-processed substrate, microwaves are introduced in a process space above the to-be-processed substrate via the microwave window from a microwave antenna electrically connected to a microwave power source and provided on the microwave transmitting window, and plasma excitation of a plasma gas including the rare gas is carried out.

2. The fluorine-containing carbon film forming method as claimed in claim 1, wherein:
   said substrate processing apparatus comprises:
   a processing chamber defined by an outer wall and provided with a supporting table supporting the to-be-processed substrate; and
   an exhaust opening exhausting the processing chamber, wherein:
   said microwave transmitting window is set above the processing chamber, a plasma gas supplying part supplying the plasma gas is inserted between the processing chamber and the microwave transmitting window, and said microwave transmitting window forms a part of the outer wall of the processing chamber.

3. The fluorine-containing carbon film forming method as claimed in claim 1, wherein:
   a coaxial waveguide supplies power to said microwave antenna, which comprises an antenna body having an opening part, a microwave emitting surface having a plurality of slots provided there provided in such a manner to cover the opening part of said antenna body, and a dielectric provided between the antenna body and the microwave emitting surface.

4. The fluorine-containing carbon film forming method as claimed in claim 1, wherein:
   said rare gas includes Ar.

5. The fluorine-containing carbon film forming method as claimed in claim 1, wherein:
   said rare gas includes Kr.

6. The fluorine-containing carbon film forming method as claimed in claim 1, wherein:
   said rare gas includes Xe.

7. The fluorine-containing carbon film forming method as claimed in claim 1, wherein:
   said process space is separated, by an electrically conductive material structure, into a first space facing the microwave transmitting window and a second space facing the to-be-processed substrate, a processing gas used as a raw material forming the fluorine-containing carbon film is provided to the second process space, and the second process is carried out in said substrate processing apparatus.

8. The fluorine-containing carbon film forming method as claimed in claim 7, wherein:
   said electrically conductive material structure comprises a processing gas supplying part supplying the processing gas to the second space.

9. The fluorine-containing carbon film forming method as claimed in claim 8, wherein:
   said processing gas supplying part comprises a plurality of opening parts passing therethrough plasma produced in the processing chamber, a processing gas passage, and a plurality of processing gas supplying holes communicating from said processing gas passage to the processing chamber.

10. The fluorine-containing carbon film forming method as claimed in claim 7, wherein:
    said first process and said second process are carried out successively in said substrate processing apparatus.

11. The fluorine-containing carbon film forming method as claimed in claim 10, wherein:
    said second process is carried out after said first process, and said first process is carried out in a state in which supply of the processing gas is shut off in said substrate processing apparatus.

* * * * *